_United States Patent_ [19]

Toda et al.

[11] Patent Number: 5,051,954

[45] Date of Patent: Sep. 24, 1991

[54] SEMICONDUCTOR MEMORY DEVICE

[75] Inventors: Haruki Toda, Yokohama; Shigeo Ohshima, Tokyo; Tatsuo Ikawa, Mitaka, all of Japan

[73] Assignee: Kabushiki Kaisha Toshiba, Kawasaki, Japan

[21] Appl. No.: 406,420

[22] Filed: Sep. 11, 1989

[30] Foreign Application Priority Data

Sep. 13, 1988 [JP] Japan .............................. 63-229409

[51] Int. Cl.$^5$ .............................................. G11C 7/00
[52] U.S. Cl. .............................. 365/189.02; 365/149; 365/230.03
[58] Field of Search .............. 365/189.02, 149, 230.02, 365/230.03, 189.05, 230.08

[56] References Cited

U.S. PATENT DOCUMENTS

| 4,367,540 | 1/1983 | Shimohigashi | 365/207 |
| 4,608,666 | 8/1986 | Uchida | 365/182 |
| 4,758,987 | 7/1988 | Sakui | 365/189.05 |

_Primary Examiner_—Joseph A. Popek
_Attorney, Agent, or Firm_—Foley & Lardner

[57] ABSTRACT

Memory cells disposed in a matrix are divided into a plurality of blocks. Each block is constructed of n (n is a positive integer larger than 2) memory cell columns. One block is selected by one column address. One memory cell column in the n memory cell columns in a selected block is selected by a first gate. One memory cell column in the n memory cell colunns in a selected block is selected by a second gate. One memory cell in a selected memory cell column is selected by a row address. The data in a selected memory cell are stored in a register and output therefrom.

18 Claims, 4 Drawing Sheets

SEMICONDUCTOR MEMORY DEVICE

FIELD OF THE INVENTION

The present invention relates to a semiconductor memory device, and more particularly to a large capacity semiconductor memory device having a matrix cell array suitable for use as a large capacity image memory having a serial access function.

BACKGROUND OF THE INVENTION

FIG. 3 shows a part of a semiconductor memory device circuit as the background art of this invention, i.e. one column of a CMOS DRAM having a serial access function. In FIG. 3, a bit line equalizer circuit, precharger circuit and the like are omitted, and only those circuit portions associated with data sensing and transfer are shown. Each bit line of a pair of bit lines BLN and $\overline{BLN}$ is connected with the same number of cells. A $V_{PL}$ line is a fixed electrode of a cell capacitor. The bit line pair BLN, $\overline{BLN}$ is pre-charged to $1/2 V_{cc}$. When a word line $WL_1$ and $WL_2$ is activated, the contents (data) of a cell which appear on one of the bit line pairs are compared with a reference voltage $1/2 V_{cc}$ on the other of the bit line pair, and amplified by a sense amplifier. In sensing the data, a line SAN is first disabled and then a line SAP is activated. After a sufficient potential difference is obtained between the bit line pair BLN, $\overline{BLN}$, a line CSL of a selected column is activated to transfer the data to data lines DQ and $\overline{DQ}$. The data is read in this manner.

If the data is to be transferred to and stored in serial data registers, a transfer gate TRG common to all columns is activated to thereby transfer the data to the data register. At a cycle other than the transfer cycle, the transfer gate TRG takes a low level and is closed. In response to an external serial mode signal, serial gates SSL are sequentially activated to sequentially transfer and output the data in the data registers connected to respective columns, to serially input/output lines SI/O, $\overline{SI/O}$.

As described above, according to the background art, a serial register is provided for each column to conduct serial access in the column direction.

The larger the memory capacity becomes, the smaller the pitch between columns becomes. It is therefore difficult to provide for each column a serial circuit portion such as serial registers. There is a tendency that a cell capacitance is made smaller, whereas the capacitance of the bit line pair BLN, $\overline{BLN}$ becomes large, mainly due to the addition of the serial circuit portion. Namely, the pitch between columns becomes large because it depends upon the serial circuit portion such as serial registers. It is therefore impossible to have a cell array with a highly efficient pattern. In addition, the read-out quantity of cell data becomes small and considerably deteriorates a sense margin.

SUMMARY OF THE INVENTION

The present invention has been made in consideration of the above problems and seeks to provide semiconductor memory device allowing a cell array having a small pitch between columns without any pattern restriction at the serial circuit portion, and having a small ratio of bit line capacitance to a cell capacitance, and an improved sense margin.

According to one aspect of this invention, one column address can select a block constructed of n (n is a positive integer larger than (2) memory cell columns. One of the n memory cell columns in each block can be selected by first or second gate means. When comparing the present invention with the background art where one column address selects one memory cell column, the bit line length of one memory cell column of this invention becomes shorter in accordance with the number of memory cell, columns selected by one column address, when the number of memory cells is the same, i.e., when the number of memory cells in the block selected by one column address as in this invention is the same as the number of memory cells in one memory column selected by one column address as in the background art. The shorter the bit line length becomes, the smaller the capacitance between bit lines becomes. Therefore, the bit line capacitance becomes small relative to the cell capacitance and the sense margin is thereby improved.

According to another aspect of this invention, one block is selected by one column address. From the block, one of the memory cell columns is selected. From the memory cell column, one of the memory cells is selected. The data in one memory cell is stored in register means and output therefrom. Register means is not provided for each of the memory cell columns, but is provided for a set of n memory cell columns (block) selectable by one column address. The number of register means becomes small when compared with the background art where register means is provided for each memory cell column. Consequently, without any restriction against patterning of register means and the associated serial circuit portions, it is possible to realize a cell array having a most efficient pitch between columns.

DESCRIPTION OF THE PREFERRED EMBODIMENTS

Figure 1:
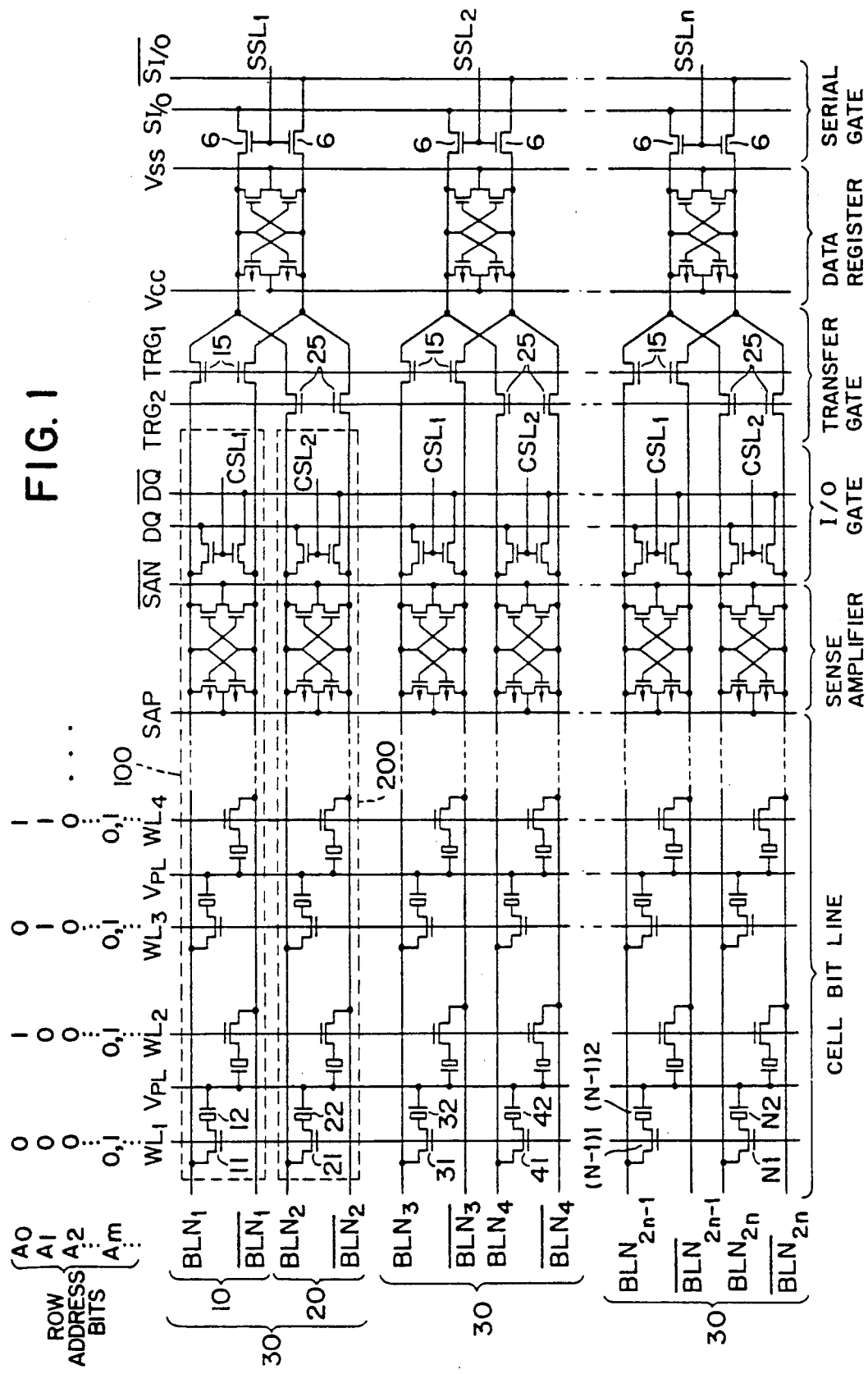
FIG. 1 is a circuit diagram showing an embodiment of a semiconductor memory device according to the present invention.

FIG. 1 is a circuit diagram showing an embodiment of a part (bundled columns) of a semiconductor memory device according to the present invention. Bit lines $\overline{BLN_1}$ and $\overline{BLN_1}$ constitute a bit line pair 10, and bit lines $BLN_2$ and $\overline{BLN_2}$ constitute a bit line pair 20.

Each of the bit lines $BLN_1$, $\overline{BLN_1}$, $BLN_2$ and $\overline{BLN_2}$ is connected with the same number of memory cells via transistors. A $V_{PL}$ line is a fixed electrode of a cell capacitor. The bit lines $BLN_1$, $\overline{BLN_1}$, $BLN_2$ and $\overline{BLN_2}$ are precharged to $\frac{1}{2} V_{cc}$. For example, when a word line $WL_1$ is activated to turn on transistors 11 and 21, the contents (data) of cells 12 and 22 appear on the bit lines $BLN_1$ and $BLN_2$ to change their potentials. The potentials on the bit lines $\overline{BLN}_1$ and $\overline{BLN}_2$ are respectively compared with a reference voltage $\frac{1}{2} V_{cc}$ on the other bit lines $BLN_1$ and $BLN_2$ and amplified by sense amplifiers. In sensing the data, a line $\overline{SAN}$ is first disabled and then a line SAP is activated. After a sufficient potential difference is obtained between the bit line pair $BLN_1$ and $\overline{BLN}_1$, and between the bit line pair $BLN_2$ and $\overline{BLN}_2$, a line ($CSL_1$ or $CLS_2$) of a selected column is activated to transfer the data to data lines DQ and $\overline{DQ}$. The data is read in this manner. The above operations are substantially the same as the case when a word line $WL_2$ is activated. The bit line pairs 10 and 20 have one different row address bit $A_m$. The lines $CSL_1$ and $CSL_2$ are therefore accessed through decoding the column address and the row address bit $A_m$. Upon such decoding, one of the partial columns 100 and 200 is selected and connected to data lines DQ and $\overline{DQ}$ to read out the data.

If the data are transferred to a serial circuit portion, a transfer gate $TRG_1$ or $TRG_2$ is activated in accordance with the one row address bit $A_m$ to turn on a transistor 15 or 25, to thereby transfer the sensed data of the partial column 100 or 200 to a data register and stored therein. The stored data are output in response to an external serial mode signal. Specifically, as shown in FIG. 1, serial gates $SSL_1$ to $SSL_n$ provided for each of the blocks (bundled columns) are sequentially activated to turn on transistors 6, 6. The contents of data registers for respective bundled columns are sequentially transferred and output to serial input/output lines SI/O and $\overline{SI/O}$.

Figure 4:
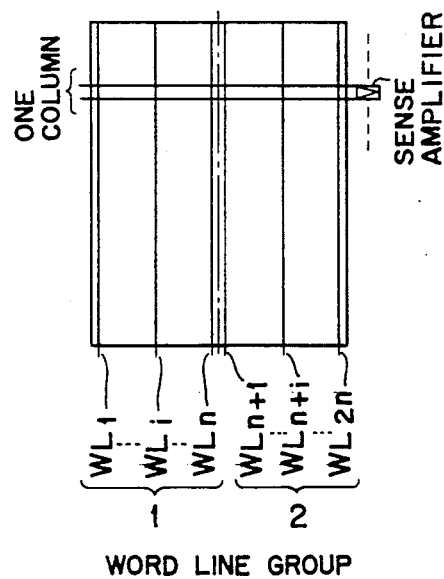
FIG. 4 is a schematic diagram showing an example of a cell array according to the background art.

Next, the cell array circuit arrangement of this embodiment will be described while comparing it with the background art. FIG. 4 is a schematic diagram showing an example of a cell array according to the background art. Word lines are divided into two groups at the center of cell array indicated by a one-dot-chain line, the groups each being accessed by a similar address except one row address bit $A_m$. That is, $2_n$ word lines are divided into a group of word lines $WL_1 \ldots WL_i \ldots WL_n$ and a group of word lines $WL_{n+1} \ldots WL_{n+1} \ldots WL_{2n}$, each group being accessed by similar address except for one row address bit $A_m$.

Figure 2A:
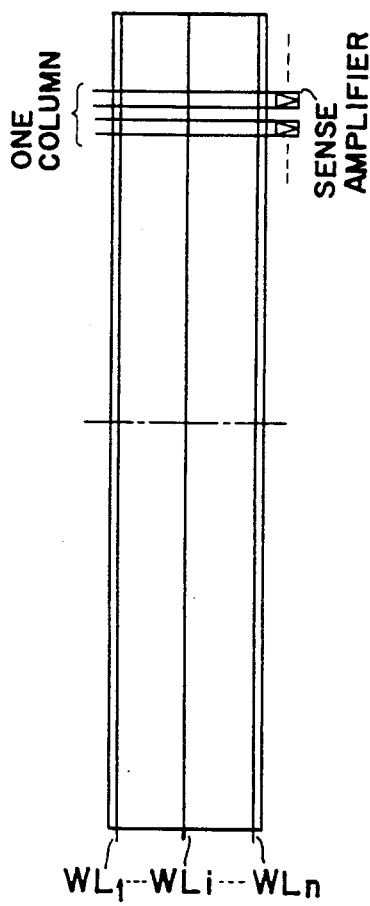
FIGS. 2A and 2B are schematic diagrams showing examples of a cell array of the memory device shown in FIG. 1.
Figure 2B:
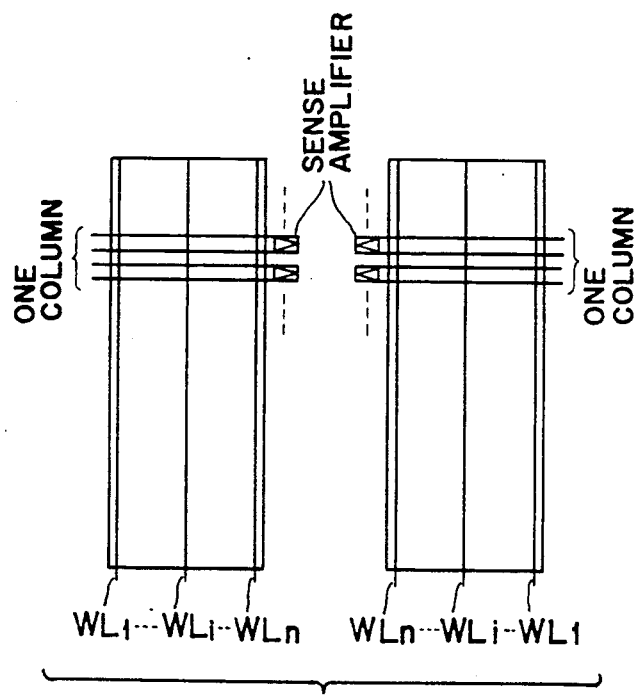
Figure 3:
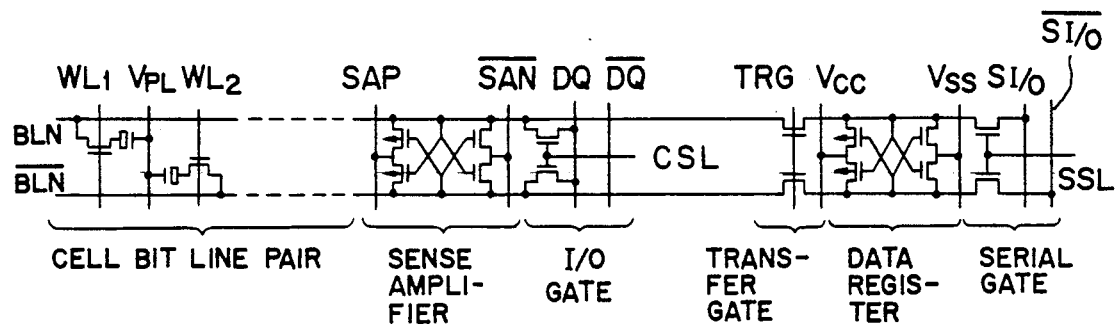
FIG. 3 is a circuit diagram showing one column of a semiconductor memory device according to the background art.

FIG. 2A shows an example of a cell array of the semiconductor memory of this invention. The ratio of the vertical side to the horizontal side of the array shown in FIG. 2A is about four times as large as that of the array shown in FIG. 4. The cell array shown in FIG. 2B has a ratio similar to that of the background art. This array is realized by dividing the cell array into upper and lower parts relative to the middle of the array indicated at a one-dot-chain line in FIG. 2A, and disposing them side by side as shown in FIG. 2B. With this cell array, it is not necessary to change the layout of the background art memory chip to a large extent.

Figure 5:
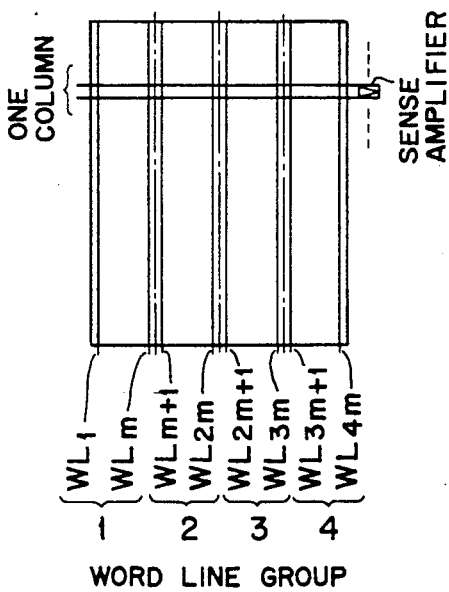
FIG. 5 is a schematic diagram showing an example of a cell array with four divided columns according to the background art.
Figure 6:
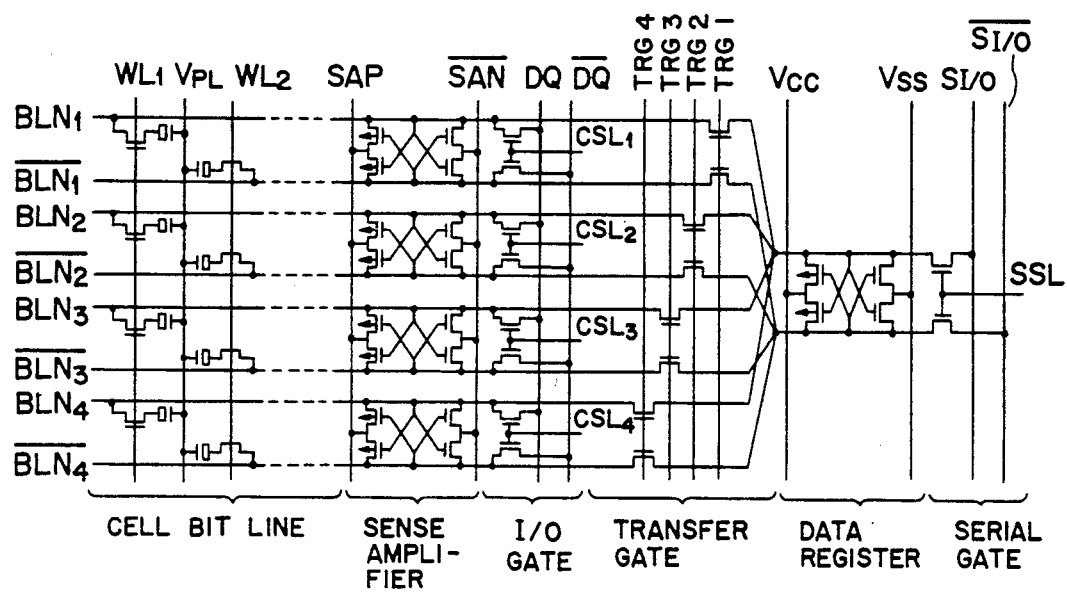
FIG. 6 is a circuit diagram showing another embodiment of a semiconductor memory device according to this invention.
Figure 7:
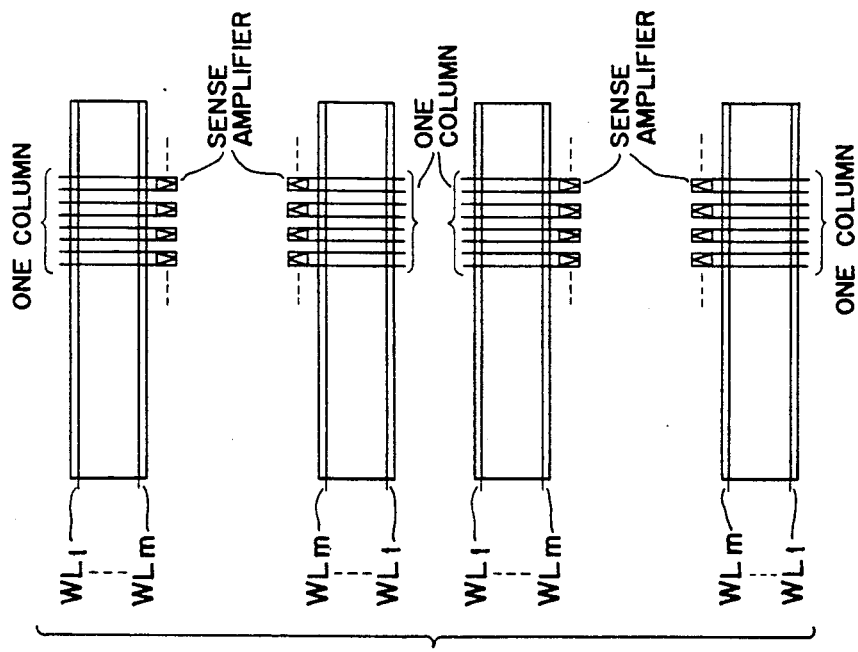
FIG. 7 is a schematic diagram showing a cell array of the memory device shown in FIG. 6.

A part of a circuit diagram of a second embodiment of a semiconductor memory device according to this invention is shown in FIG. 6. The cell array of the memory device is schematically shown in FIG. 7. In this embodiment, four partial columns are connected to one serial circuit portion. With this arrangement, the capacitance of each bit line becomes one fourth that of the background art, and the pattern at the serial circuit portion can be designed with a pitch four times as large as that of the background art. FIG. 5 shows an example of a cell array divided into four groups according to the background art. In FIG. 5, word lines are divided into four groups each being distinguished by two row address bits $A_m$ and $A_n$. Lines $CSL_1$ to $CLS_4$ shown in FIG. 6 are accessed by decoding one column address and the row address bits $A_m$ and $A_n$. Transfer gates $TRG_1$ and $TRG_4$ are actuated in correspondence with the row address bits $A_n$ and $A_m$. FIG. 7 illustrates a cell array, similar to FIG. 2B, wherein four columns are disposed side by side. A general cell array divided into $2^n$ may be realized in a similar manner.

As described bit cells provided for one, column of the background art are divided into $2^n$ cell groups, and each group is connected to a different bit line pair and connected to each sense amplifier. The capacitance of each bit line is therefore reduced by $1/2^n$ when compared with the background art, to thereby improve the sense margin. In addition, by bundling a number of bit line pairs, the serial circuit portion such as data registers can be patterned with a pitch $2^n$ times as large as that of the background art. The pitch between columns is not determined on the basis of the serial circuit portion, so that an optimum cell size can be selected In addition, it is possible to obtain a cell layout as desired, without changing the chip layout of the background art, i.e., without changing the chip vertical/horizontal side ratio.

What is claimed is:

1. A dynamic address multiplexed semiconductor memory deice, accessed by multiplexed row and column addresses, said memory device comprising:
 a plurality of memory cell blocks in a row direction, each of said blocks having n memory cell columns, where n is a positive integer greater than or equal to 2, each of said memory cell columns having a plurality of memory cells in a column direction and a sense amplifier to sense data stored in a selected memory cell, wherein
 each of said memory cell rows is selected by row addresses, each of said memory cell rows having a plurality of said memory cells in said row direction,
 n memory cell columns in the same memory cell block are selected by column addresses, and
 each of said memory cell blocks includes first gate means for selecting one of said n memory cells selected by said row and column addresses to enable data transfer to and from said selected memory cell such that said first gate means operates after operation of said sense amplifier.

2. A semiconductor memory device according to claim 1, wherein al of said blocks are disposed in said row direction.

3. A semiconductor memory device according to claim 1, wherein one n-th of the total number of said plurality of memory cell blocks are disposed in said row direction to form one block group, and n said block groups are disposed in said column direction.

4. A semiconductor memory device according to claim 1, wherein said first gate means is activated in accordance with a row address and a column address.

5. A semiconductor memory device according to claim 4, wherein all of said blocks are disposed in said row direction.

6. A semiconductor memory device according to claim 4, wherein one-th of the total number of said plurality of memory cell blocks are disposed in said row direction to form one block group, and n said block groups are disposed in said column direction.

7. A dynamic address multiplexed semiconductor memory device, accessed by multiplexed row and column addresses, said memory device comprising:
a plurality of memory cell blocks in a row direction, each of said blocks having n memory cell columns, where n is a positive integer greater than or equal to 2, memory cells in a column direction and a sense amplifier to sense data stored in a selected memory cell, wherein
each of said memory cell rows is selected by row addresses, each of said memory cell rows having a plurality of said memory cells in said row direction,
n memory cell columns in the same memory cell block are selected by column addresses,
each of said memory cell blocks is connected to a register to transfer data, and
each memory cell block is connected to a corresponding register via a second gate means for selecting one of said n memory cells selected by said row addresses at the same time to enable data transfer to and from said selected memory cell via said register.

8. A semiconductor memory device according to claim 7, wherein all of said block are disposed in said row direction.

9. A semiconductor memory device according to claim 7, wherein one n-th of the total number of said plurality of memory cell blocks are disposed in said row direction to form one block group, and n said block groups are disposed in said column direction.

10. A semiconductor memory device according to claim 7, wherein said second gate means is activated in accordance with a row address.

11. A semiconductor memory device according to claim 10, wherein all of said blocks are disposed in said row direction.

12. A semiconductor memory device according to claim 10, wherein one n-th of the total number of said plurality of memory cell blocks are disposed in said row direction to form one block group, and n said block groups are disposed in said column direction.

13. A dynamic address multiplexed semiconductor memory device, accessed by multiplexed row and column addresses, said memory device comprising:
a plurality of memory cell blocks in a row direction, each of said blocks having n memory cell columns, where n is a positive integer greater than or equal to 2, each of said memory cell columns having a plurality of memory cells in a column direction and a sense amplifier to sense data stored in a selected memory cell, wherein
each of said memory cell rows is selected y row addresses, each of said memory cell rows having a plurality of said memory cells in said row direction,
n memory cell columns in the same memory cell block are selected by column addresses,
each of said memory cell blocks is connected to a register to transfer data,
each of said memory cell blocks includes first gate means for selecting one of said n memory cells selected by said row and column addresses to enable data transfer to and from said selected memory cell such that said first gate means operates after operation of said sense amplifier, and
each memory cell block is connected to a corresponding register via a second gate means for selecting one of said n memory cells selected by said row addresses at the same time to enable data transfer to and from said selected memory cell via said register.

14. A semiconductor memory device according to claim 13, wherein all of said blocks are disposed in said row direction.

15. A semiconductor memory device according to claim 13, wherein one n-th of the total number of said plurality of memory cell blocks are disposed in said row direction to form one block group, and n said block groups are disposed in said column direction.

16. A semiconductor memory device according to claim 13, wherein said first gate means is activated in accordance with a row and column address, and said second gate means is activated in accordance with a row address.

17. A semiconductor memory device according to claim 16, wherein all of said blocks are disposed in said row direction.

18. A semiconductor memory device according to claim 16, wherein one n-th of the total number of said plurality of memory cell blocks are disposed in said row direction to form one block group, and n block groups are disposed in said column direction.

* * * * *